(12) United States Patent
Ye et al.

(10) Patent No.: US 8,080,739 B2
(45) Date of Patent: Dec. 20, 2011

(54) SIGNAL CONNECTING COMPONENT

(75) Inventors: Zhi-Gang Ye, Shanghai (CN); Xiao-Jiao Ding, Shanghai (CN); Wen-Kang Fan, Taipei (TW)

(73) Assignee: Inventec Corporation, Taipei (TW)

( * ) Notice: Subject to any disclaimer, the term of this patent is extended or adjusted under 35 U.S.C. 154(b) by 813 days.

(21) Appl. No.: 12/170,635

(22) Filed: Jul. 10, 2008

(65) Prior Publication Data

US 2009/0288868 A1 Nov. 26, 2009

(30) Foreign Application Priority Data

May 26, 2008 (TW) ................................ 97119419 A

(51) Int. Cl.
*H05K 1/11* (2006.01)
*H05K 7/00* (2006.01)
*H01R 9/00* (2006.01)

(52) U.S. Cl. ......... 174/261; 174/267; 361/772; 361/777
(58) Field of Classification Search .................. 174/261; 361/772–779
See application file for complete search history.

(56) References Cited

U.S. PATENT DOCUMENTS 7,288,726 B2 * 10/2007 Chang ........................... 174/261

* cited by examiner

*Primary Examiner* — Jeremy Norris
(74) *Attorney, Agent, or Firm* — J.C. Patents

(57) ABSTRACT

A signal connecting component is suitable to be disposed on a circuit board. The signal connecting component includes an insulation element, at least a first bridge line, at least a second bridge line, a plurality of first pins and a plurality of second pins. The first bridge line and the second bridge line are disposed on different layers of the insulation element. The first pins and the second pins are respectively electrically connected to both ends of the first bridge line and both ends of the second bridge line.

10 Claims, 2 Drawing Sheets

SIGNAL CONNECTING COMPONENT

CROSS-REFERENCE TO RELATED APPLICATION

This application claims the priority benefit of Taiwan application serial no. 97119419, filed on May 26, 2008. The entirety of the above-mentioned patent application is hereby incorporated by reference herein and made a part of this specification.

BACKGROUND OF THE INVENTION

1. Field of the Invention

The present invention generally relates to an electronic component, in particular, to a signal connecting component.

2. Description of Related Art

Along with the trend of the electronic devices towards light-slim-short-small design and multiple functions, the required electric circuits in an electronic device gets more complex. In order to meet the above-mentioned demand of a circuit, the circuit board thereof is designed to have a smaller and smaller area. Meanwhile, the circuits on a circuit board are laid out in higher density to achieve various functions. To realize the most compact wiring layout and the highest efficiency, a circuit board today is unavoidably designed to have a multilayer structure.

On the other hand, a circuit and the wiring layout thereof often have different function requirements in the initial design phase and the post design phase with various electronic products. Therefore, in the post design phase, the previously designed circuit may be largely modified, wherein one of the difficult issues is to rewire a circuit and it often requires to connect in cross way a circuit to another, even requires to connect in vertical way a circuit between different layers so as to meet a specific signal transmission requirement.

Another hard point accompanied by the above-mentioned difficult issue needs to be considered that the signal circuits to be connected to each other often have different line lengths. In order to make signal transmission with matching impedances, the line lengths of the circuits often are adjustable and controlled to achieve a consistent transmission quality.

Confronting the above-mentioned difficult issues, the traditional solution in the prior art is to re-design the circuits or to add extra layers in a circuit board reserved for modifying the circuits. Obviously, the first conventional solution costs labour and time, and the second conventional solution requires a significantly increasing layer number. In fact, a conventional circuit board often has four layers, six layers, eight layers even over ten layers. With the increasing number of layers, the operation efficiency of a circuit board is lowered down and the manufacturing cost thereof soars in a multiple scale. Therefore, how to reduce the layer number and increase the efficiency is a significant issue today for the relevant manufactures under big market competition burden.

SUMMARY OF THE INVENTION

Accordingly, the present invention is directed to a signal connecting component suitable for a circuit board to connect separate circuits thereon and thereby controlling the line lengths of the circuits on the circuit board.

The present invention provides a signal connecting component, which includes an insulation element, at least a first bridge line, at least a second bridge line, a plurality of first pins and a plurality of second pins. The first bridge line and the second bridge line are respectively disposed on different layers of the insulation element, wherein the first pins are electrically connected to both ends of the first bridge line, and the second pins are electrically connected to both ends of the second bridge line.

In an embodiment of the present invention, the above-mentioned first bridge line and second bridge line are arranged in cross way to each other and spaced from each other.

In an embodiment of the present invention, the above-mentioned circuit board has separate four circuits of a first circuit, a second circuit, a third circuit and a fourth circuit. The first bridge line is electrically connected between the first circuit and the second circuit via the first pins, and the second bridge line is electrically connected between the third circuit and the fourth circuit via the second pins.

In an embodiment of the present invention, the total line length of the above-mentioned first circuit, second circuit and first bridge line is equivalent to the total line length of the third circuit, the fourth circuit and the second bridge line.

In an embodiment of the present invention, the above-mentioned first pins and second pins are coplanarly supported on the circuit board.

In an embodiment of the present invention, a metallic shielding layer is disposed in the above-mentioned insulation layer to insulate the first bridge line from the second bridge line.

In an embodiment of the present invention, the above-mentioned metallic shielding layer includes a grounding plane.

In an embodiment of the present invention, the above-mentioned different layers of the insulation element are selected from an upper surface, a lower surface and at least an interlayer located between the upper surface and the lower surface.

In an embodiment of the present invention, the line length of the above-mentioned first bridge line is greater than the length of the second bridge line.

In an embodiment of the present invention, the line length of the first bridge line is equal to the length of the second bridge line.

In an embodiment of the present invention, the number of the first bridge line and the number of the second bridge line are respectively single or multiple.

The signal connecting component provided by the present invention utilizes a first bridge line and a second bridge line in association with the corresponding first pins and second pins to connect originally separate circuits to each other without increasing the layer number of a circuit board. Besides, the present invention is able to control the total line length of the circuit on the circuit board by using different line lengths of the bridge lines, which can avoid abnormal functions of the circuit board caused by asynchronous signals during transmitting a high-speed signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
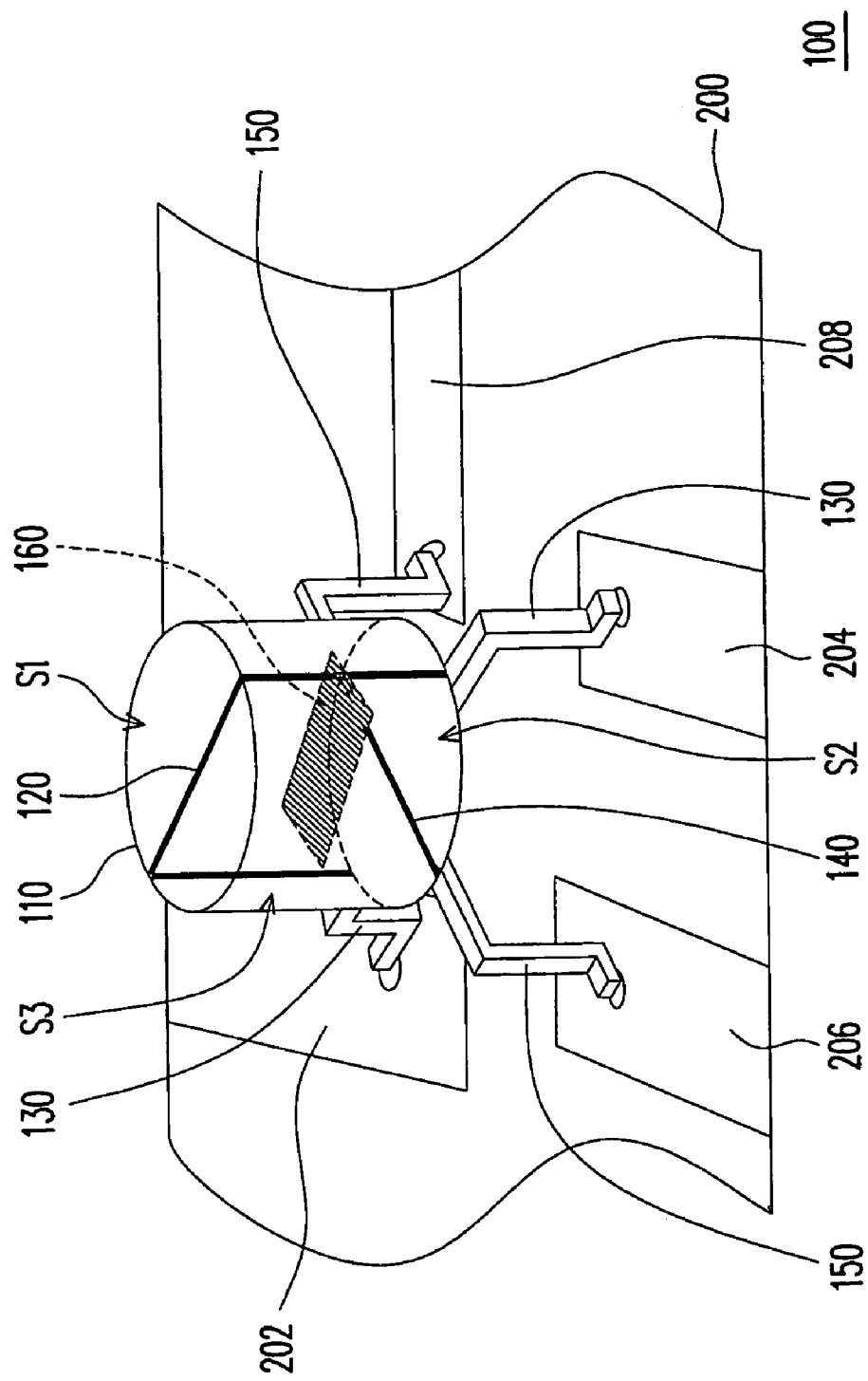
FIG. 1 is a diagram of a signal connecting component according to the first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
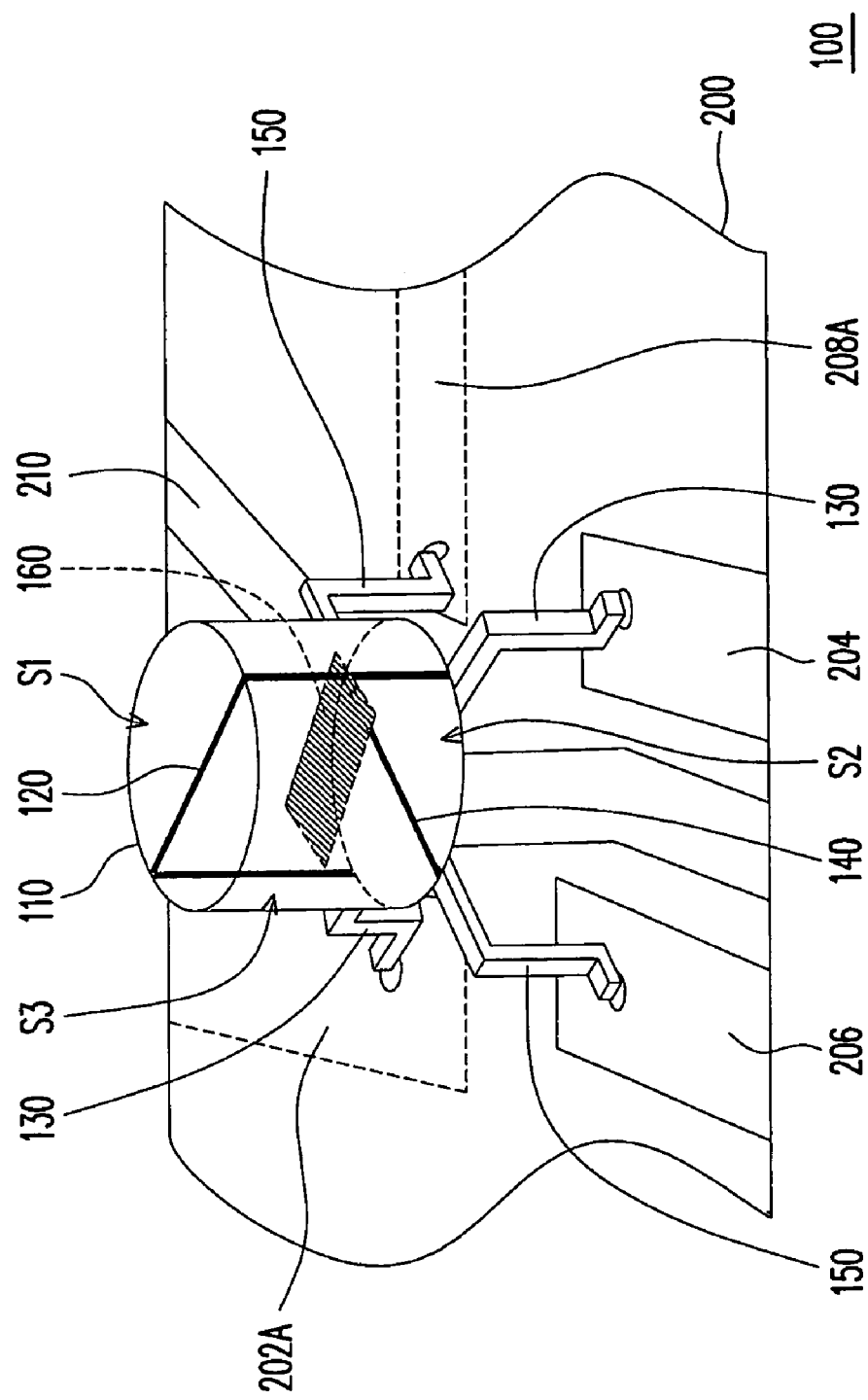
FIG. 2 is a diagram of a signal connecting component for connecting circuits on different layers of a circuit board according to the second embodiment of the present invention.

FIG. 1 is a diagram of a signal connecting component 100 according to the first embodiment of the present invention. FIG. 2 is a diagram of a signal connecting component 100 for connecting circuits on different layers of a circuit board according to the second embodiment of the present invention.

Referring to FIG. 1, a signal connecting component 100 includes an insulation element 110, at least a first bridge line 120, at least a second bridge line 140, a plurality of first pins 130 and a plurality of second pins 150. The signal connecting component 100 is suitable to be disposed on a circuit board 200 and the circuit board 200 has separate four circuits of a first circuit 202, a second circuit 204, a third circuit 206 and a fourth circuit 208. In order to make the signal connecting component 100 easily connect the separate four circuits, the second bridge line 140 is disposed on a lower surface S2 of the insulation element 110, and the first bridge line 120 is disposed on a upper surface S1 and a side surface S3 of the insulation element 110 so as to stride over the second bridge line 140. The upper surface S1 where the first bridge line 120 is disposed on and the lower surface S2 where the second bridge line 140 is disposed on are roughly parallel to each other, but the first bridge line 120 is not parallel to the second bridge line 140. In stead, the first bridge line 120 and the second bridge line 140 are arranged in cross way to each other so as to avoid signal interferences.

In another embodiment (not shown), the first bridge line 120 and the second bridge line 140 are not necessarily disposed on the upper surface S1 and the lower surface S2 of the insulation element 110, which is defined by the above-mentioned embodiment. In fact, the bridge lines can be disposed on different layers of the insulation element 110 depending on the design need of circuit wiring, for example, disposed on different inter-layers between the upper surface S1 and the lower surface S2.

Then, the first pins 130 are electrically connected to both ends of the first bridge line 120 to establish a connection path between the separate first circuit 202 and second circuit 204; the second pins 150 are electrically connected to both ends of the second bridge line 140 to establish a connection path between the separate third circuit 206 and fourth circuit 208. By using the above-mentioned wiring way to realize signal transmission between the signal connecting component 100 and the circuit board 200 overcomes the disadvantage in the prior art that the circuit board 200 must increase the layer number thereof to realize the signal transmission.

In the embodiment, the total line length of the first circuit 202, the second circuit 204 and the first bridge line 120 may be equivalent to the total line length of the third circuit 206, the fourth circuit 208 and the second bridge line 140, which is intended for avoiding a circuit fault due to inconsistent signal transmissions after employing the signal connecting component 100. In addition, the signal connecting component 100 is able to control the line lengths of the circuit board.

Thus, when the total line length of the first circuit 202 and the second circuit 204 is less than the total line length of the third circuit 206 and the fourth circuit 208, the line length of the first bridge line 120 may be greater than the line length of the second bridge line 140 to compensate the deficient line length of the circuit.

In another embodiment (not shown), the line length of the first bridge line 120 can be equal to that of the second bridge line 140, which is intended for avoiding inconsistent line length after employing the signal connecting component 100 since the line length of the separate circuits are originally equal to each other. In short, the signal connecting component 100 can control the total line length of the circuits.

In the embodiment, the first pins 130 and the second pins 150 are coplanarly mounted on the circuit board 200 and make the signal connecting component 100 to be supported on the circuit board 200, so that the signal connecting component 100 is able to be mounted on the circuit board 200 by using surface mount technology (SMT). The signal connecting component served to connect the separate circuits on the circuit board 200 is advantageous in not only avoiding to increase the layer number of the circuit board 200, but also keeping the original basic design of the circuit board 200 unchanged, which further reduces the labor and time for the design and keeps the flexibility of deploying the signal connecting component 100 in future according to the requirement of the circuit board 200.

In the embodiment, the above-mentioned insulation element 110 has a metallic shielding layer 160 located between the first bridge line 120 and the second bridge line 140 to insulate the lines from contacting each other, which is helpful to avoid an electromagnetic interference (EMI) to affect the signal transmissions caused by turned-on circuits. Moreover, the metallic shielding layer 160 includes a grounding plane (not shown) to keep the circuits having a certain voltage difference so as to avoid the noise interference during transmitting signals for transmission stability.

Referring to FIG. 2, in the second embodiment of the present invention, the circuit board 200 has separate two circuits of a first circuit 202A and a fourth circuit 208A both disposed on the same layer, and separate two circuits of a second circuit 204 and a third circuit 206 both disposed on the same layer (but different from the above-mentioned layer). The circuit board 200 further has a fifth circuit 210 between the above-mentioned circuits so that the above-mentioned circuits are unable to be connected to each other.

At the time, the signal connecting component 100 is supported on the circuit board 200 through the pins. In this way, the first bridge line 120 is connected to the first circuit 202A and the second circuit 204 via the first pins 130, and the second bridge line 140 is connected to the third circuit 206 and the fourth circuit 208A via the second pins 150, where the signal connecting component 100 strides over the fifth circuit 210 to make the separate circuits connected for transmitting signals.

In another embodiment (not shown), the first bridge line and the second bridge line are parallel to each other and meanwhile stride over other circuits. At the time, the metallic shielding layer is disposed between the first bridge line and the second bridge line and perpendicular to the upper surface and the lower surface of the insulation element.

In another embodiment (not shown), the signal connecting component 100 has a plurality of first bridge lines 120 and a plurality of second bridge lines 140, i.e., the first bridge line 120 and the second bridge line 140 are not restricted as a single line, which is used to connect a plurality of separate circuits or control the line length. The separate circuits of the circuit board 200, no matter located on a same layer or different layers, are suitable to be connected through the first bridge lines and the second bridge lines of the signal connecting component 100 by using SMT process.

In summary, the signal connecting component of the present invention is suitable to connect separate circuits on a circuit board or connect separate circuits striding over the other circuits on the same layer, wherein the signal connecting component is disposed in 3D-space. The present invention is advantageous in that no extra layers are needed to change the circuit connections to effectively simplify the circuits and reduce unnecessary manufacturing cost. On the other hand, since the line length is adjustable in the present invention; therefore, no matter the line lengths of the circuits of the original circuit board are the same or not, the signal connecting component is able to control the line lengths to achieve a synchronous transmission of signals.

Moreover, the signal connecting component can keep the original design of the circuit board, where the basic expansion design is reserved for future need. When a plurality of bridge lines is needed to connect separate circuits, it is easier to be implemented, which not only saves the labour and time for the initial design phase, but also increases the convenience and the utilization of the circuit board functions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal connecting component, suitable to be disposed on a circuit board, the signal connecting component comprising:
   an insulation element;
   at least a first bridge line and at least a second bridge line respectively disposed on different layers of the insulation element;
   a plurality of first pins electrically connected to both ends of the first bridge line; and
   a plurality of second pins electrically connected to both ends of the second bridge line, wherein the first pins and the second pins are coplanarly supported on the circuit board, the first bridge line and the second bridge line are located on the same side of the circuit board, and the circuit board has separate four circuits of a first circuit, a second circuit, a third circuit, and a fourth circuit on the same plane.

2. The signal connecting component according to claim 1, wherein the first bridge line and the second bridge line are arranged in cross way to each other and spaced from each other.

3. The signal connecting component according to claim 1, wherein the first bridge line is electrically connected between the first circuit and the second circuit via the first pins, and the second bridge line is electrically connected between the third circuit and the fourth circuit via the second pins.

4. The signal connecting component according to claim 3, wherein the total line length of the first circuit, the second circuit and the first bridge line is equivalent to the total line length of the third circuit, the fourth circuit and the second bridge line.

5. The signal connecting component according to claim 1, wherein a metallic shielding layer is disposed in the insulation element to insulate the first bridge line from the second bridge line.

6. The signal connecting component according to claim 5, wherein the metallic shielding layer includes a grounding plane.

7. The signal connecting component according to claim 1, wherein different layers of the insulation element are selected from an upper surface, a lower surface and at least an interlayer located between the upper surface and the lower surface.

8. The signal connecting component according to claim 1, wherein the line length of the first bridge line is greater than the length of the second bridge line.

9. The signal connecting component according to claim 1, wherein the line length of the first bridge line is equal to the length of the second bridge line.

10. The signal connecting component according to claim 1, wherein the number of the first bridge line and the number of the second bridge line are respectively single or multiple.

* * * * *